(12) United States Patent
Someya

(10) Patent No.: US 6,807,029 B2
(45) Date of Patent: Oct. 19, 2004

(54) WIRING MEMBER OF SUSPENSION FOR DISC DRIVE HAVING ELECTRICALLY CONDUCTIVE SUBSTRATE WITH SLIT BETWEEN READ WIRE AND WRITE WIRE

(75) Inventor: Ikuo Someya, Sagamihara (JP)

(73) Assignee: NHK Spring Co., Ltd., Yokohama (JP)

( * ) Notice: Subject to any disclaimer, the term of this patent is extended or adjusted under 35 U.S.C. 154(b) by 267 days.

(21) Appl. No.: 10/067,055

(22) Filed: Feb. 4, 2002

(65) Prior Publication Data

US 2002/0105760 A1 Aug. 8, 2002

(30) Foreign Application Priority Data

Feb. 8, 2001 (JP) ........................................ 2001-032559

(51) Int. Cl.⁷ ............................ G11B 21/16; G11B 5/48
(52) U.S. Cl. ...................................... 360/245.9; 360/246
(58) Field of Search .............................. 360/246, 245.9, 360/245.8, 245.3, 244, 240, 234.5, 264.2, 266.3; 365/189.11

(56) References Cited

U.S. PATENT DOCUMENTS

| | | | | |
|---|---|---|---|---|
| 5,737,152 A | * | 4/1998 | Balakrishnan | 360/245.9 |
| 5,986,853 A | * | 11/1999 | Simmons et al. | 360/245.9 |
| 6,125,015 A | * | 9/2000 | Carlson et al. | 360/245.9 |
| 6,249,404 B1 | * | 6/2001 | Doundakov et al. | 360/245.4 |
| 6,256,172 B1 | | 7/2001 | Griesbach | 360/246 |

* cited by examiner

Primary Examiner—Julie Anne Watko
(74) Attorney, Agent, or Firm—Frishauf, Holtz, Goodman & Chick, P.C.

(57) ABSTRACT

A wired flexure comprises a substrate formed of an electrically conductive material, a read wire provided on the substrate so as to extend along the substrate, a write wire provided on the substrate so as to extend along the read wire, a slit formed between the read and write wires, etc. The slit extends along the read and write wires and divides the substrate between a first portion on the read wire side and a second portion on the write wire side. The slit is situated nearer to the read wire than to the write wire.

12 Claims, 4 Drawing Sheets

This application is based upon and claims the benefit of priority from the prior Japanese Patent Application No. 2001-032559, filed Feb. 8, 2001, the entire contents of which are incorporated herein by reference.

WIRING MEMBER OF SUSPENSION FOR DISC DRIVE HAVING ELECTRICALLY CONDUCTIVE SUBSTRATE WITH SLIT BETWEEN READ WIRE AND WRITE WIRE

CROSS-REFERENCE TO RELATED APPLICATIONS

This application is based upon and claims the benefit of priority from the prior Japanese Patent Application No. 2001-032559, filed Feb. 8, 2001, the entire contents of which are incorporated herein by reference.

BACKGROUND OF THE INVENTION

1. Field of the Invention

The present invention relates to a wiring member of a suspension for a disc drive incorporated in an information processing apparatus such as a personal computer.

2. Description of the Related Art

A hard disc drive (HDD) for recording and reading information or a rotating magnetic disc or magneto-optical disc has a carriage that can turn around a shaft. This carriage is turned around the shaft by means of a positioning motor. The carriage is provided with an arm (actuator arm), a suspension on the distal end portion of the arm, a head portion including a slider attached to the suspension, etc.

When the disc rotates, the slider on the distal end portion of the suspension is slightly lifted from the surface of the disc, and an air bearing is formed between the disc and the slider. The suspension comprises a base portion including a base plate, a load beam portion formed of a thin precise plate spring, a flexure fixed to the load beam portion by laser welding or the like, etc.

The flexure may be formed variously depending on required specifications. By way of example, there is a newly developed wired flexure designed so that a wiring portion is provided on the surface of a substrate that extends in the longitudinal direction of a load beam portion along it. The wired flexure includes a stainless-steel substrate in the form of a very thin sheet, read and write wires on the substrate, etc. An electrical insulating layer formed of an electrical insulating material such as polyimide is interposed between the substrate and the wires.

One end of each of the reading and writing wires of the wired flexure is connected electrically to a terminal of a slider that is attached to the distal end portion of the flexure. The respective other ends of the read and write wires are connected individually to terminals that are located near the actuator arm, for example.

The thinner the electrical insulating layer of the suspension that is provided with the wired flexure constructed in this manner, the shorter the distance between the substrate and the read wire or between the substrate and the write wire is.

Possibly, therefore, current that causes noise may leak from the write wire, through which a relatively high current flows, toward the read wire. If various stray currents (e.g., looped eddy current) from any regions other than the write wire flow into the read wire, radio interference or so-called crosstalk may be caused in some cases. This interference constitutes a hindrance to the transmission of normal signals.

Leakage of current from the write wire to the substrate may possibly be restrained by removing a part of the substrate (electrically conductive material) at the back of the write wire. If this is done, however, various stray currents from any regions other than the write wire may flow into the read wire through the substrate, in some cases. Thus, the partial removal of the substrate cannot be a drastic measure to counter the leakage of current.

On the other hand, the leakage of current may possibly be restrained by removing a part of the substrate at the back of the read wire. In this case, however, no electrically conductive material (ground surface) exists at the back of the read wire, so that the impedance is higher than in the case where a conductive material exists at the back of the read wire. Thus, it is hard to secure impedance matching with an electrical component connected to the wire, so that signals are subject to substantial distortion.

Based on these circumstances, there is a demand for a wiring member of a suspension for a disc drive that enjoys improved crosstalk characteristic without failing to secure impedance matching of the read wire.

BRIEF SUMMARY OF THE INVENTION

A wiring member according to the present invention comprises a substrate formed of an electrically conductive material such as stainless steel, a read wire provided on an electrical insulating layer on the substrate so as to extend along the substrate, a write wire provided on the electrical insulating layer on the substrate so as to extend along the read wire, and a slit formed between the read and write wires of the substrate so as to extend along the wires and dividing the substrate between a first portion on the read wire side and a second portion on the write wire side.

According to the wiring member of the invention, impedance matching can be secured between the read wire and an electrical component to which the read wire is connected. Further, stray currents can be restrained from flowing into the read wire through the write wire or any other part, so that the crosstalk characteristic can be improved.

Preferably, in the present invention, the slit is situated nearer to the read wire than to the write wire. Since the slit is situated close to the read wire, according to this invention, stray currents can be restrained more effectively from flowing into the read wire.

An example of the substrate is a substrate of a wired flexure carrying a slider thereon. In the wired flexure, according to this invention, impedance matching can be secured between the read wire and an electrical component to which the read wire is connected. Further, stray currents can be restrained from flowing into the read wire through the write wire or any other part, so that the crosstalk characteristic can be further improved.

A part of the substrate may be provided with a connecting portion connecting the first and second portions to each other. According to this invention, the connecting portion on the substrate can accurately regulate the relative positions of the first and second portions.

In the present invention, the read wire may have a portion crossing the slit and overlying the first and second portions, and the read wire may be fixed to both the first and second portions. According to this invention, the first and second portions can be connected mechanically to each other by utilizing a part of the read wire that crosses the slit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
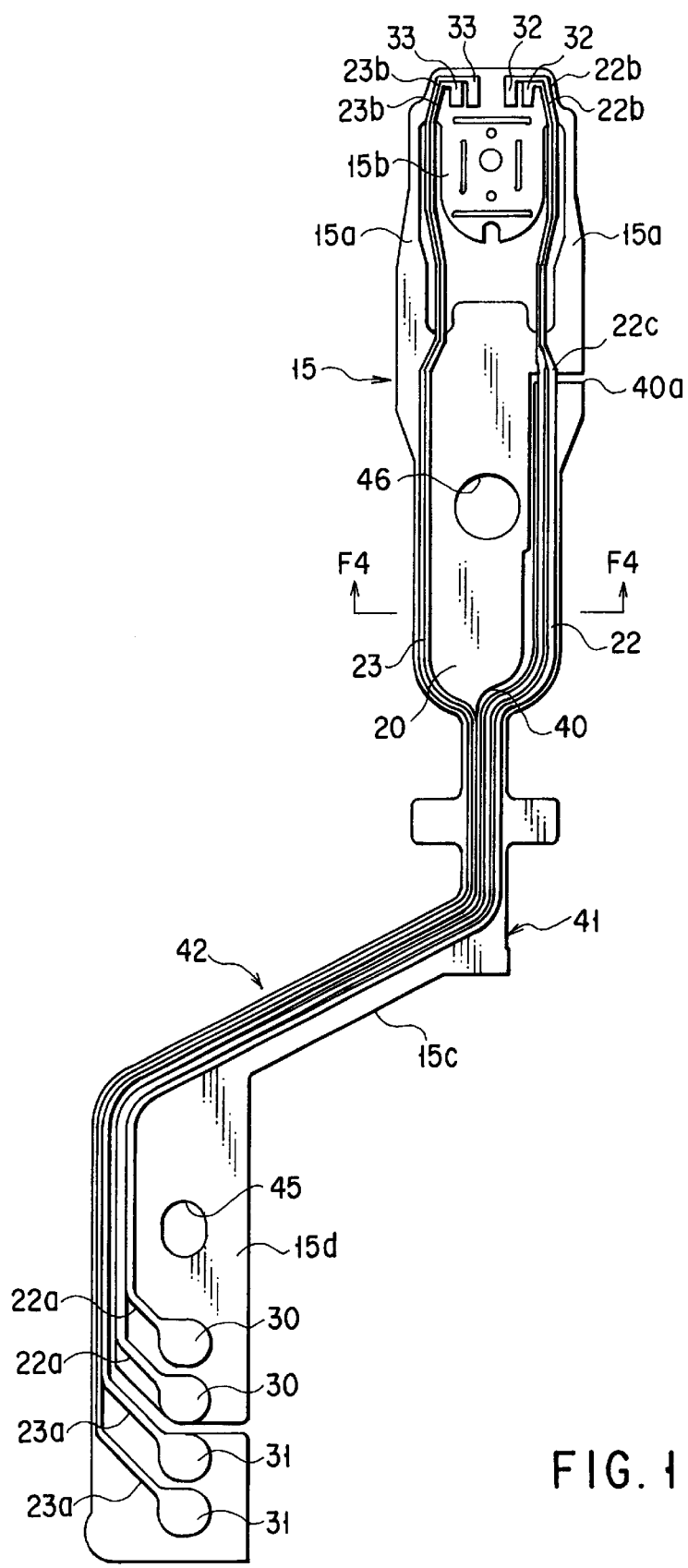
FIG. 1 is a plan view of a wiring member according to a first embodiment of the invention.

A first embodiment of the present invention will now be described with reference to FIGS. 1 to 4. A suspension 10 for a disc drive shown in FIG. 3 comprises a base portion 12 including a base plate 11, a load beam portion 14 extending from the base portion 12 toward a head portion 13 of the suspension 10, a wired flexure 15 attached to the load beam portion 14, etc. The wired flexure 15 is an example of a wiring member according to the present invention. The base portion 12 is fixed to an actuator arm (not shown) of the disc drive.

Figure 4:
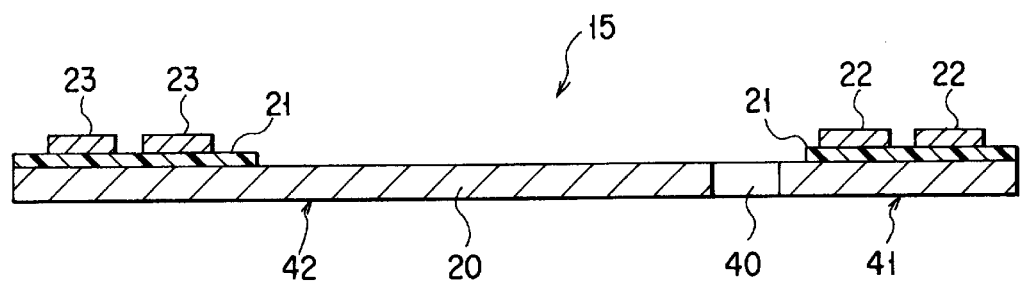
FIG. 4 is a sectional view of the wiring member taken along line F4—F4 of FIG. 1.

As shown in FIGS. 1 and 4, the wired flexure 15 is provided with a substrate 20 that is formed of a springy electrically conductive material (e.g., rolled stainless steel) that is thinner than the load beam portion 14. The substrate 20 and the load beam portion 14 are about 20 μm and 100 μm thick, respectively, for example. An electrical insulating layer 21 of a synthetic resin such as polyimide is formed on the substrate 20.

At least a pair of read wires 22 is formed on the electrical insulating layer 21 so as to extend along the substrate 20. At least a pair of write wires 23 is formed on the insulating layer 21 so as to extend along the read wires 22. The wires 22 and 23 are formed of an electrically conductive material such as copper. The wires 22 and 23, having a given pattern each, are formed by etching a thin copper sheet that is put on the electrical insulating layer 21 or forming a copper layer having a desired pattern by plating. The wires 22 and 23 are fixed to the substrate 20 by means of the electrical insulating layer 21.

Formed on the distal end portion of the substrate 20 of the wired flexure 15 is a pair of outrigger portions 15a that can bend in the thickness direction of the wired flexure 15 and a tongue portion 15b that is supported by means of the outrigger portions 15a. The tongue portion 15b is fitted with a slider 16 (indicated by a two-dot chain line in FIG. 3) that constitutes the head portion 13. The substrate 20 has an extending portion 15c that extends toward the base portion 12.

The slider 16 is provided with a magneto-electric transducer such as an MR element for reciprocal conversion between electrical and magnetic signals. Recorded data on a disc that is read by means of the magneto-electric transducer is converted into electrical information and transmitted to a data processor (not shown) by means of the read wires 22.

In recording data on the disc, electrical information of the data to be recorded is transmitted from the data processor to the magneto-electric transducer by means of the write wires 23.

The substrate 20 of the wired flexure 15 is attached to the load beam portion 14 in a manner such that it overlaps the load beam portion 14 in its thickness direction. For example, the substrate 20 is fixed to the load beam portion 14 by laser welding or the like in positions other than the outrigger portions 15a and the tongue portion 15b.

One end 22a of each read wire 22 and one end 23a of each write wire 23 are connected, respectively, to terminals 30 and 31 that are formed on a proximal portion 15d of the wired flexure 15. The other end 22b of each read wire 22 and the other end 23b of each write wire 23 are connected, respectively, to terminals 32 and 33 that are provided on the tongue portion 15b. The terminals 32 and 33 are connected electrically to a terminal portion of the magneto-electric transducer of the slider 16 by wire bonding or the like.

Figure 2:
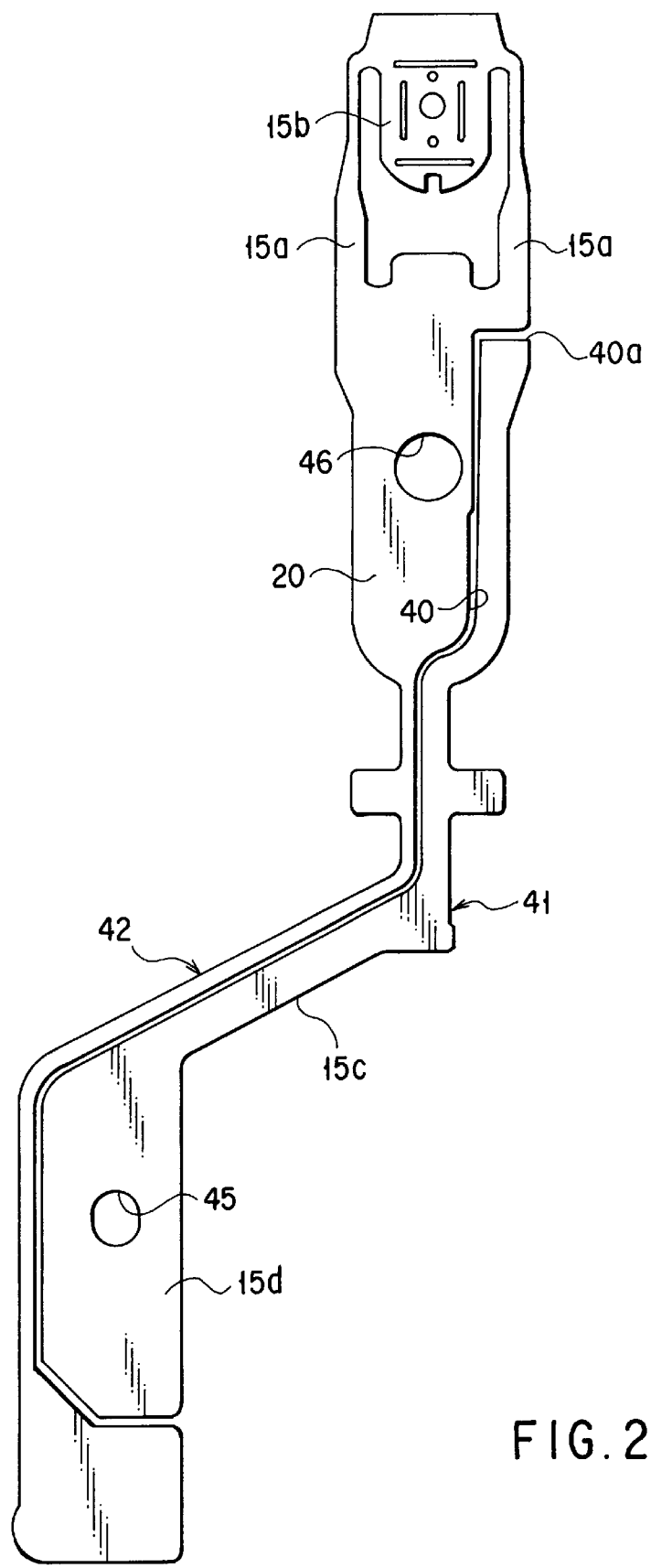
FIG. 2 is a plan view of a substrate of the wiring member shown in FIG. 1.
Figure 3:
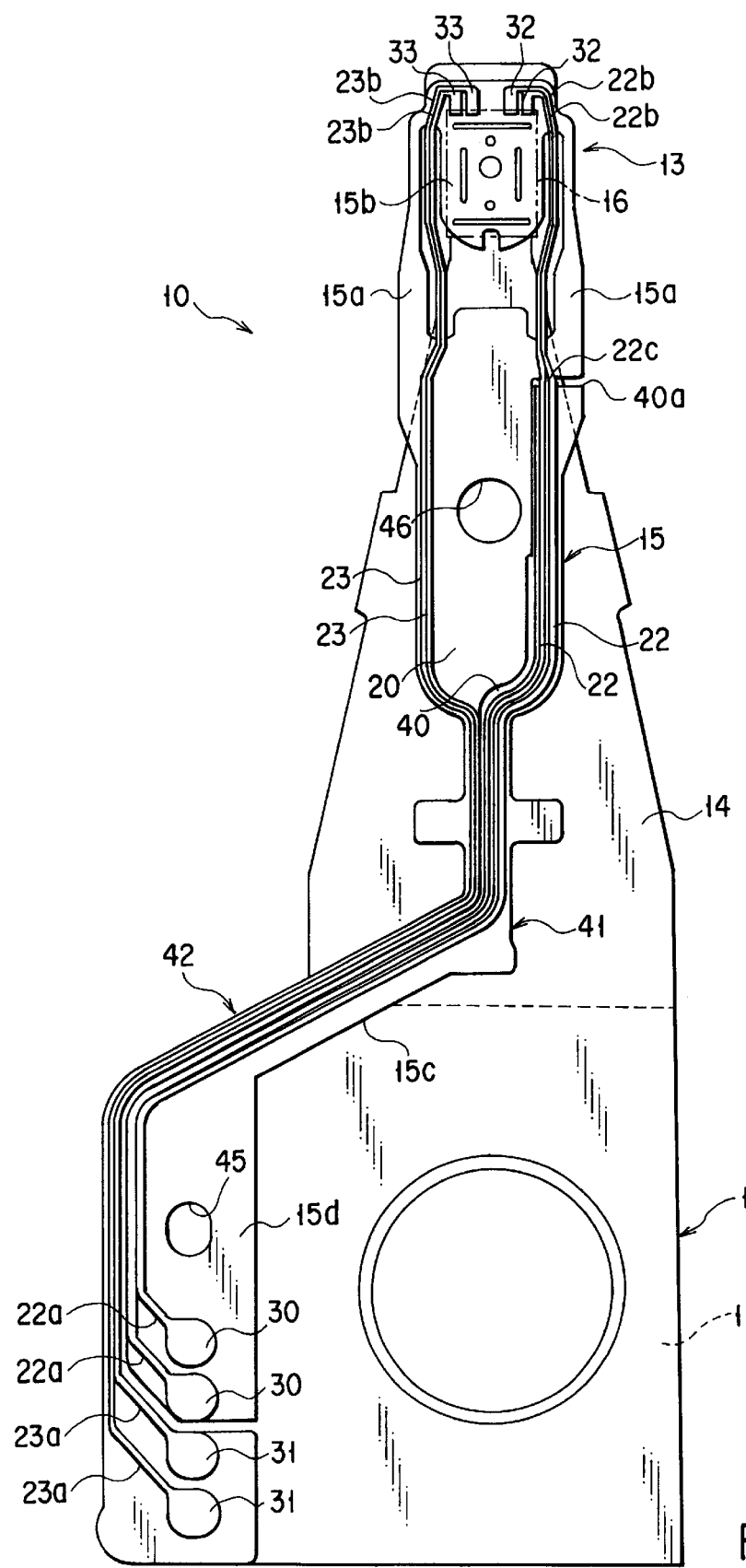
FIG. 3 is a plan view of a suspension for a disc drive provided with the wiring member shown in FIG. 1.

As shown in FIGS. 2 and 4 and other drawings, a slit 40 is formed between the read and write wires 22 and 23 so as to extend along the read wires 22. The slit 40 is formed by etching, for example, and is preferably situated nearer to the read wires 22 than to the write wires 23. The slit 40 divides the substrate 20 into two portions, a first portion 41 that is situated on the read wire side and a second portion 42 that is situated on the write wire side.

As shown in FIG. 1, a portion 22c of each read wire 22 crosses a region near an end portion 40a of the slit 40. The portion 22c extends over both the first and second portions 41 and 42. Since the read wires 22 are fixed to both the first and second portions 41 and 42, the portions 41 and 42 are connected to each other by means of the portions 22c of the read wires 22. The first and second portions 41 and 42 are formed having respective positioning holes 45 and 46 that are used in positioning the flexure 15 with respect to the load beam portion 14.

In the wired flexure 15 of this embodiment, the slit 40 is formed near the read wires 22 so as to extend along the wires 22. Thus, stray currents that cause noise such as crosstalk can be restrained from flowing into the read wires 22 through the write wires 23 or the like. Besides, the substrate 20, an electrically conductive material, exists behind the read wires 22. Accordingly, impedance matching can be secured between the read wires 22 and other electrical components (e.g., a magneto-electric transducer on the head portion 13) to which the wires 22 are connected. Thus, signals to be transmitted can be restrained from being distorted.

Figure 5:
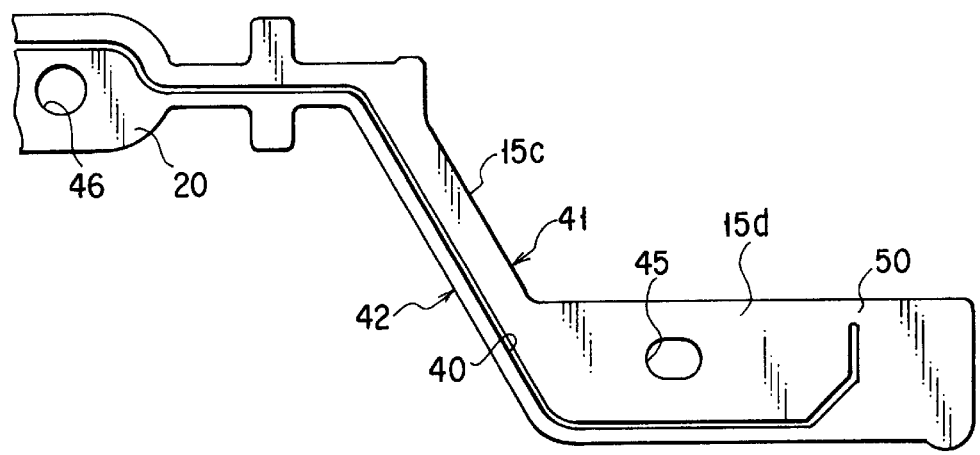
FIG. 5 is a plan view of a part of a substrate of a wiring member according to a second embodiment of the invention.

As in the case of a second embodiment of the invention shown in FIG. 5, moreover, a part of a substrate 20 may be provided with a connecting portion 50 for connecting first and second portions 41 and 42 to each other. For the configurations of parts other than the connecting portion 50, a suspension of this second embodiment resembles the suspension 10 of the first embodiment. In the second embodiment, the first and second portions 41 and 42 are connected by means of the connecting portion 50 that is formed on one end portion of a slit 40. On the other end portion of the slit 40, as in the case of the wired flexure 15 shown in FIG. 3, moreover, the first and second portions 41 and 42 are connected by means of a portion 22c of each read wire 22.

Thus, the relative positions of the first and second portions 41 and 42 can be regulated more accurately, so that the relative positions of two positioning holes 45 and 46 can be also settled accurately. This facilitates accurate positioning of the flexure 15 with respect to the load beam portion 14. In order to restrain a looped eddy current from being produced in the substrate 20, moreover, it is advisable to provide only one connecting portion 50, a part of the substrate 20.

The present invention is also applicable to any wiring members other than the wired flexure. In carrying out the present invention based on these embodiments, it is to be understood that the components of the invention, including the respective shapes of the wiring member and the substrate, the read and write wires, the slit, and the respective configurations of the first and second portions of the substrate may be variously changed and modified without departing from the scope or spirit of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A wiring member of a suspension for a disc drive, comprising:
    a substrate formed of an electrically conductive material;
    a read wire provided on an electrical insulating layer on the substrate so as to extend along the substrate;
    a write wire provided on the electrical insulating layer on the substrate so as to extend along the read wire; and
    a slit formed between the read wire and the write wire and extending along the wires so as to divide the substrate between a first portion on a read wire side and a second portion on a write wire side;
    wherein a part of the substrate is provided with a connecting portion connecting the first and second portions.

2. A wiring member according to claim 1, wherein the slit is situated nearer to the read wire than to the write wire.

3. A wiring member according to claim 2, wherein the substrate is a substrate of a wired flexure carrying a slider thereon.

4. A wiring member according to claim 1, wherein the substrate is a substrate of a wired flexure carrying a slider thereon.

5. A wiring member of a suspension for a disc drive, comprising:
    a substrate formed of an electrically conductive material;
    a read wire provided on an electrical insulating layer on the substrate so as to extend along the substrate;
    a write wire provided on the electrical insulating layer on the substrate so as to extend along the read wire; and
    a slit formed between the read wire and the write wire and extending along the wires so as to divide the substrate between a first portion on a read wire side and a second portion on a write wire side;
    wherein the read wire includes a portion crossing the slit and overlying the first portion and the second portion, and the read wire is fixed to both the first portion and the second portion.

6. A wiring member according to claim 5, wherein the slit is situated nearer to the read wire than to the write wire.

7. A wiring member according to claim 6, wherein the substrate is a substrate of a wired flexure carrying a slider thereon.

8. A wiring member according to claim 5, wherein the substrate is a substrate of a wired flexure carrying a slider thereon.

9. A wiring member of a suspension for a disc drive, comprising:
    a substrate formed of an electrically conductive material;
    a read wire provided on an electrical insulating layer on the substrate so as to extend along the substrate;
    a write wire provided on the electrical insulating layer on the substrate so as to extend along the read wire; and
    a slit formed between the read wire and the write wire and extending along the wires so as to divide the substrate between a first portion on a read wire side and a second portion on a write wire side;
    wherein a part of the substrate is provided with a connecting portion connecting the first and second portions; and
    wherein the read wire includes a portion crossing the slit and overlying the first portion and the second portion, and the read wire is fixed to both the first portion and the second portion.

10. A wiring member according to claim 9, wherein the slit is situated nearer to the read wire than to the write wire.

11. A wiring member according to claim 10, wherein the substrate is a substrate of a wired flexure carrying a slider thereon.

12. A wiring member according to claim 9, wherein the substrate is a substrate of a wired flexure carrying a slider thereon.

* * * * *